United States Patent
Chiu et al.

(10) Patent No.: US 8,410,480 B2
(45) Date of Patent: Apr. 2, 2013

(54) CMOS-MEMS CANTILEVER STRUCTURE

(75) Inventors: Chin-Fong Chiu, Hsinchu (TW); Ying Zong Juang, Hsinchu (TW); Hann Huei Tsai, Hsinchu (TW); Sheng-Hsiang Tseng, Hsinchu (TW); Chen-Fu Lin, Hsinchu (TW)

(73) Assignee: National Chip Implementation Center National Applied Research Laboratories, Hsinchu (TW)

( * ) Notice: Subject to any disclaimer, the term of this patent is extended or adjusted under 35 U.S.C. 154(b) by 548 days.

(21) Appl. No.: 12/708,546

(22) Filed: Feb. 19, 2010

(65) Prior Publication Data
US 2011/0133256 A1 Jun. 9, 2011

(30) Foreign Application Priority Data
Dec. 9, 2009 (TW) .............................. 98141974 A

(51) Int. Cl.
*H01L 29/04* (2006.01)
*H01L 31/036* (2006.01)
*H01L 31/20* (2006.01)
*H01L 31/0376* (2006.01)

(52) U.S. Cl. ..... 257/55; 257/204; 257/538; 257/E21.19; 257/E21.109; 257/E21.218; 257/E21.221; 257/E21.32; 257/E21.632; 257/E21.645

(58) Field of Classification Search .................... 257/55, 257/52, 69, 204, 347, 359, 538, 381, 754, 257/E21.19, E21.218, E21.221, E21.32, E21.632, 257/E21.109, E21.645
See application file for complete search history.

(56) References Cited

U.S. PATENT DOCUMENTS

| | | | |
|---|---|---|---|
| 7,196,457 B2* | 3/2007 | Miyazawa et al. | 310/358 |
| 7,228,735 B2* | 6/2007 | Sparks et al. | 73/204.26 |
| 8,174,352 B2* | 5/2012 | Parpia et al. | 338/2 |

\* cited by examiner

*Primary Examiner* — David Nhu
(74) *Attorney, Agent, or Firm* — Stites & Harbison, PLLC; Juan Carlos A. Marquez, Esq.

(57) ABSTRACT

The present invention discloses a CMOS-MEMS cantilever structure. The CMOS-MEMS cantilever structure includes a substrate, a circuit structure, and a cantilever beam. The substrate has a circuit area and a sensor unit area defined thereon. The circuit structure is formed in the circuit area. The cantilever beam is disposed in the sensor unit area with one end floating above the substrate and the other end connecting to the circuit structure. With the above arrangement, the manufacturing process of CMOS-MEMS cantilever structure of this invention can be simplified. Furthermore, the structure of the cantilever beam is thinned down and therefore has a higher sensitivity.

4 Claims, 7 Drawing Sheets

CMOS-MEMS CANTILEVER STRUCTURE

BACKGROUND OF THE INVENTION

1. Technical Field

The present invention is related to a CMOS-MEMS cantilever structure, and particularly to a CMOS-MEMS cantilever structure using polysilicon as its piezoresistive material.

2. Description of Related Art

In the field of micro electro-mechanical systems (MEMS), cantilever beams are used in a wide variety of applications such as flow meters, biosensors, probes for atomic force microscopes, accelerometers, etc. Therefore, cantilever beams are literally one of the most frequently used structures, which are often manufactured from silicon, silicon nitride or polymer.

FIG. 1 shows a conventional MEMS cantilever device 10 manufactured by using a SOI (Silicon on Insulator) substrate 11 as its base material. The SOI substrate 11 includes a first silicon layer 13, a silicon dioxide layer 14 and a second silicon layer 15, and deposited thereon are a silicon dioxide layer 16, a piezoresistive material layer 17 and a metal layer 18. After a front-side and a back-side etching process, a cantilever beam 12 can be released from its peripheral structure to float. The cantilever beam 12 includes the second silicon layer 15, the silicon dioxide layer 14 and the piezoresistive material layer 17, and can be connected to a circuit structure through the metal layer 18.

FIG. 2 shows another conventional MEMS cantilever device 20. The MEMS cantilever device 20 mainly uses a silicon substrate 21 which is partially ion implanted to become an n-type well structure 21a. On the silicon substrate 21 and the n-type well structure 21a are deposited a silicon dioxide layer 22 and a silicon nitride layer 23, sequentially. A cantilever beam 24 as shown in FIG. 2 is formed after several etching processes.

However, the cantilever beams 12 and 24 described above suffer from shortcomings in terms of practical application. For example, relatively expensive SOI substrates are required to manufacture the cantilever beam 12, which increases costs. Furthermore, fabrication of the cantilever beams 12 and 24 involves complicated manufacturing processes which also result in higher manufacturing costs. For example, during the back-side etching process of fabrication of the cantilever beams 12 and 24, where wet etching technology is required, cleansing and drying after wet etching will increase the manufacturing time. Moreover, in order to protect the front-side structure on the MEMS cantilever devices 10 and 20, a protection device is required on the front surface before a back-side etching can be conducted, thereby increasing the complexity of operating procedures.

BRIEF SUMMARY OF THE INVENTION

The present invention discloses a CMOS-MEMS cantilever structure which employs a design of a cantilever beam floating over a substrate to facilitate the manufacturing of such a CMOS-MEMS cantilever structure.

The present invention discloses a CMOS-MEMS cantilever structure which comprised of two structure layers, which are a supporting material layer and a piezoresistive material layer. Thus, the cantilever beam of the CMOS-MEMS cantilever structure can has a lighter and thinner structure, thereby increasing the sensing sensitivity of the cantilever beam.

To achieve the above and other objectives and functions, the present invention provides a CMOS-MEMS cantilever structure, which includes a substrate having a circuit area and a sensor unit area defined thereon, a circuit structure formed in the circuit area on the substrate, and a cantilever beam disposed in the sensor unit area, with one end floating above the substrate and the other end connecting to the circuit structure.

Implementation of the present invention at least involves the following inventive steps:

1. With the units design and arrangement of the CMOS-MEMS cantilever structure of the present invention, not only is it compatible with standard CMOS manufacturing processes, but the back-side etching process is also not required, thereby simplifying the manufacturing process and reducing manufacturing costs.

2. With the cantilever beam comprised of two structure layers, a lighter and thinner structure of the cantilever beam is made possible, thereby increasing the sensing sensitivity of the cantilever beam.

The features and advantages of the present invention are described in detail in the preferred embodiments of the present invention to enable persons skilled in the art to gain insight into the technical disclosure in the present invention and implement the present invention accordingly and readily understand the objectives and advantages of the present invention by making reference to the disclosure contained in the specification, the claims, and the drawings of the present invention.

DETAILED DESCRIPTION OF THE INVENTION

Figure 1:
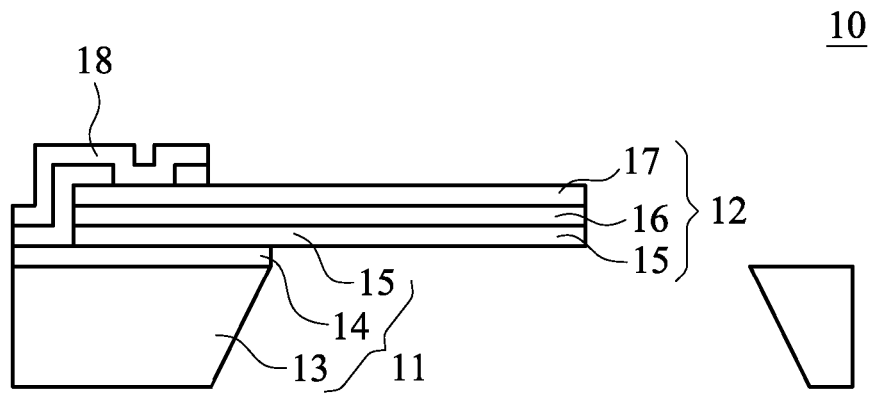
FIG. 1 shows a conventional MEMS cantilever structure.
Figure 2:
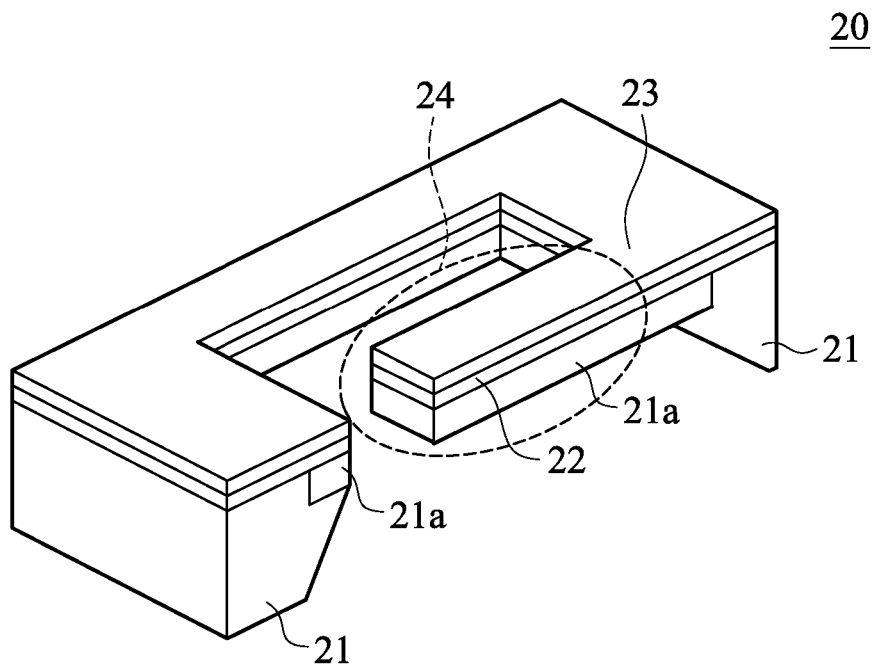
FIG. 2 shows another conventional MEMS cantilever structure.
Figure 3:
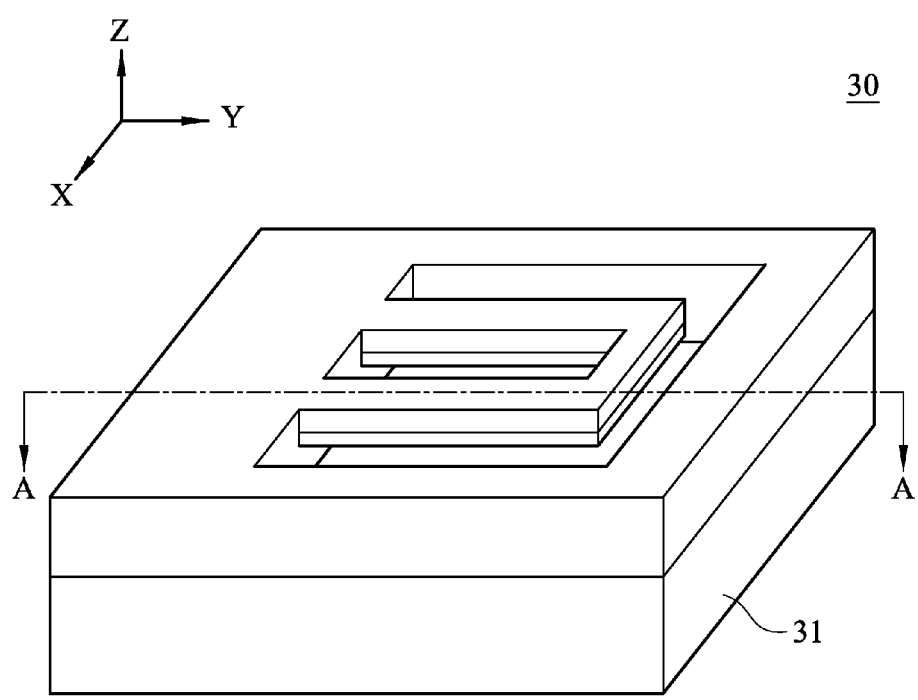
FIG. 3 is a schematic perspective view of an embodiment of a CMOS-MEMS cantilever structure of the present invention.
Figure 4:
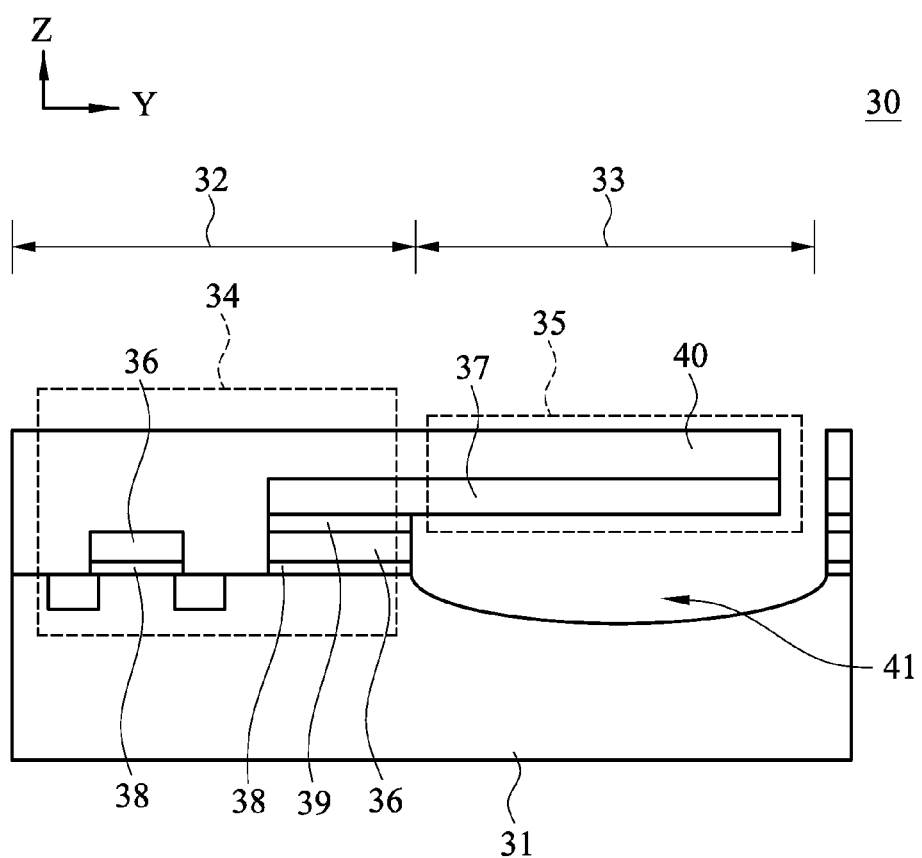
FIG. 4 is a cross-sectional view taken along Line A-A of FIG. 3.

Referring to both FIG. 3 and FIG. 4, according to an embodiment of the present invention, a CMOS-MEMS cantilever structure 30 includes a substrate 31, a circuit structure 34 and a cantilever beam 35. The substrate 31 is a silicon substrate having a circuit area 32 and a sensor unit area 33 defined thereon. Moreover, the substrate 31 further has a depressed area 41 in the sensor unit area 33, depressed inwards from the surface of the substrate 31. On the substrate 31 are formed a circuit structure 34 and a cantilever beam 35, respectively formed in the circuit area 32 and the sensor unit area 33. The circuit structure 34 and the cantilever beam 35 are both fabricated by deposition in a CMOS standard manufacturing process.

The circuit structure 34 includes a first oxide layer 38, a polysilicon layer 36 and a second oxide layer 39, wherein the first oxide layer 38 is formed by silicon dioxide which is mainly used in forming the gate oxide layer of a transistor and therefore has a smaller thickness of approximately 200 angstrom. The polysilicon layer 36 is primarily used to form the gate layer of a transistor, and in other embodiments, further includes a tungsten silicide layer for increasing the electrical conductivity of the gate interface.

The cantilever beam 35 floats above the substrate 31, and more specifically, has one end floating above the depressed area 41 of the substrate 31 and the other end connecting to the circuit structure 34. The cantilever beam 35 includes a piezoresistive material layer 37 and a supporting material layer 40, wherein the material of the piezoresistive material layer 37 is a polysilicon layer, while the supporting material layer 40 may be an oxide layer or a metal layer.

Referring to FIG. 4, the piezoresistive material layer 37 of the cantilever beam 35 is below the supporting material layer 40, and the cantilever beam 35 of this embodiment, compared to the conventional cantilever beams of more layers, is only comprised of a two-layer structure, therefore possessing of a lighter and thinner structure which reduces the rigidity characteristics of the cantilever beam 35. In addition, in order to reach a larger amplitude of vibration when exerted with external forces, the piezoresistive material layer 37 may be disposed at the bottom most location below the cantilever beam 35, away from the structural center of the entire cantilever beam 35, to produce a larger resistive variation of the piezoresistive material layer 37 when deformed by external forces, thereby increasing the sensing sensitivity of the cantilever beam 35.

Figure 5A:
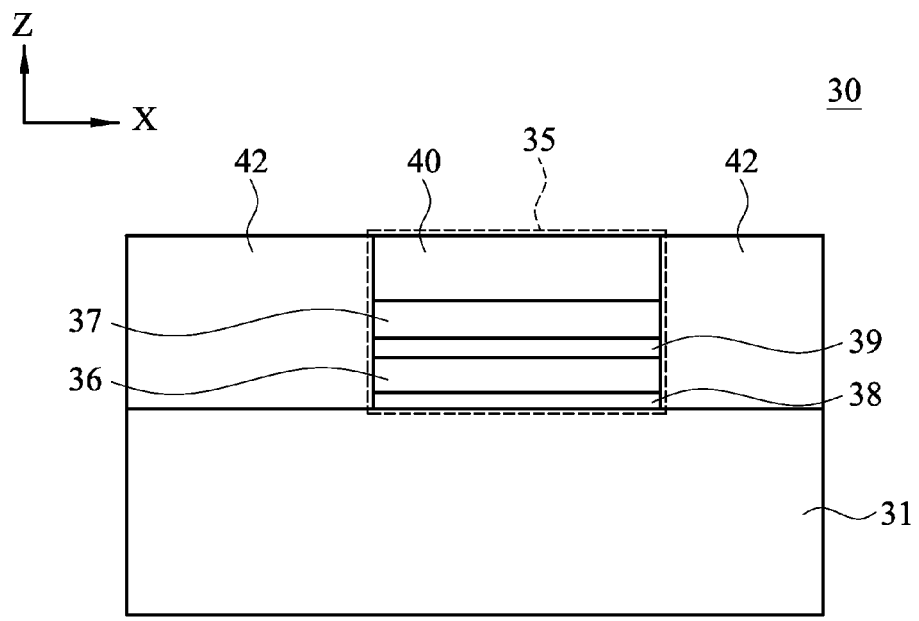
FIG. 5A to 5H are schematic drawings of the manufacturing process of a CMOS-MEMS cantilever structure of the present invention.

Referring to FIG. 5A to 5H, the advantage of a simplified manufacturing process of this embodiment will be illustrated by the following description of the manufacturing process of the CMOS-MEMS cantilever beam structure 30. FIG. 5A is a structural schematic drawing of the embodiment of the CMOS-MEMS cantilever structure 30 upon completion of the CMOS standard manufacturing process. At this moment, a first oxide layer 38, a polysilicon layer 36, a second oxide layer 39, a piezoresistive material layer 37 and a supporting material layer 40 are deposited bottom-up in sequence where the cantilever beam 35 is set to be disposed on the substrate 31. In the region outside the cantilever beam 35 is stuffed a dielectric layer 42, wherein the material of the first oxide layer 38 and the second oxide layer 39 are both silicon dioxide.

Figure 5B:
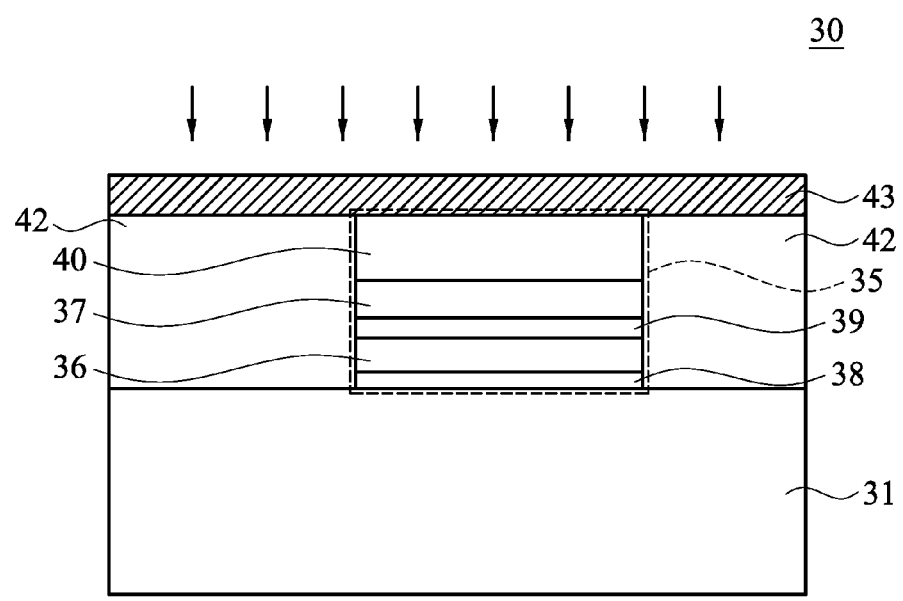
Figure 5C:
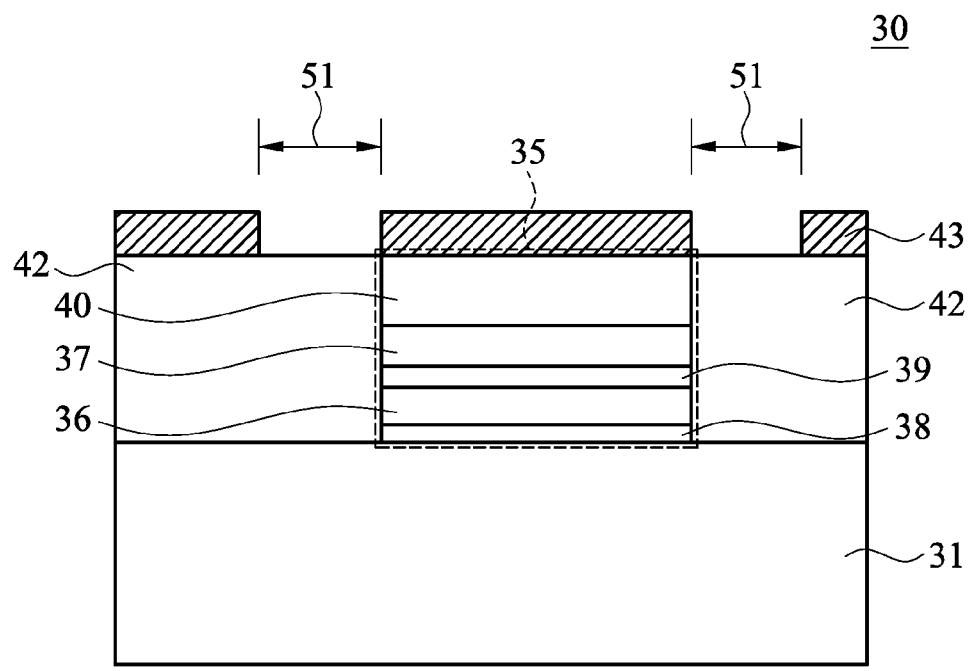

As shown in FIG. 5B, a photoresistive layer 43 is coated on the CMOS-MEMS cantilever structure 30, and an etch area 51 (as shown in FIG. 5C) is defined by a patterned photoresistive layer 43 which undergoes a lithography process.

Next, as shown in FIG. 5C, is the CMOS-MEMS cantilever structure 30 after the removal of the photoresistive layer 43 of the etch area 51. Now a first etching process begins, etching the etch area 51 of the CMOS-MEMS cantilever structure 30 with an anisotropic gas etching process, and setting the etching termination point up until the substrate 31 is reached.

Figure 5D:
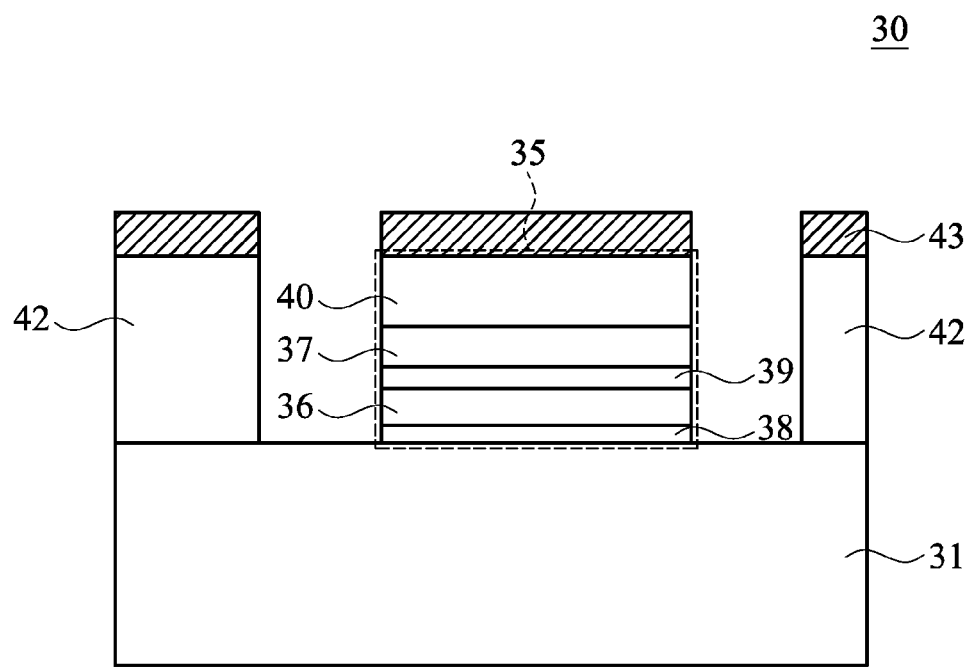
Figure 5E:
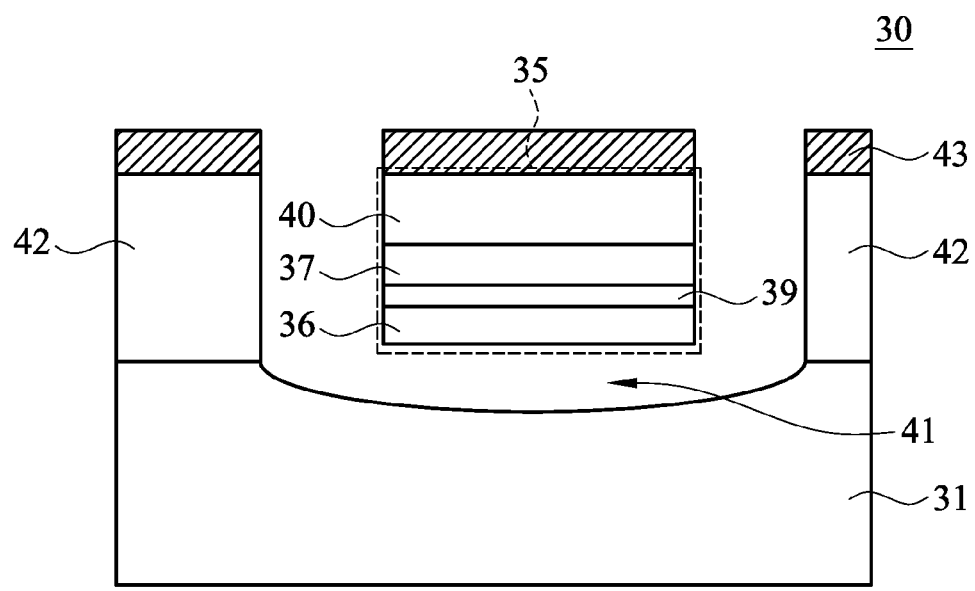

FIG. 5D shows a schematic drawing after the first etching process, which is followed by a second etching process, where silicon etching on the CMOS-MEMS cantilever structure 30 takes place with an isotropic gas etching process. Although the second etching process is targeted on silicon, it possesses considerable etching ability towards silicon dioxide. Furthermore, since the thickness of the first oxide layer 38 is only around 200 angstrom and the second etching process is an isotropic gas etching, the second etching process will also completely etch out the first oxide layer 38 (as shown in FIG. 5E) in addition to etching the substrate 31 to form a depressed area.

Figure 5F:
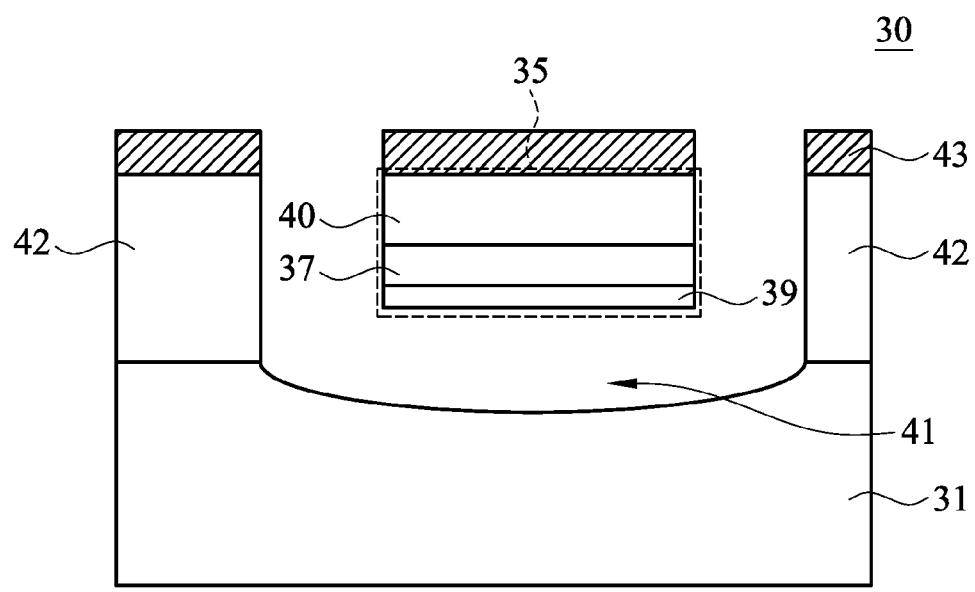
Figure 5G:
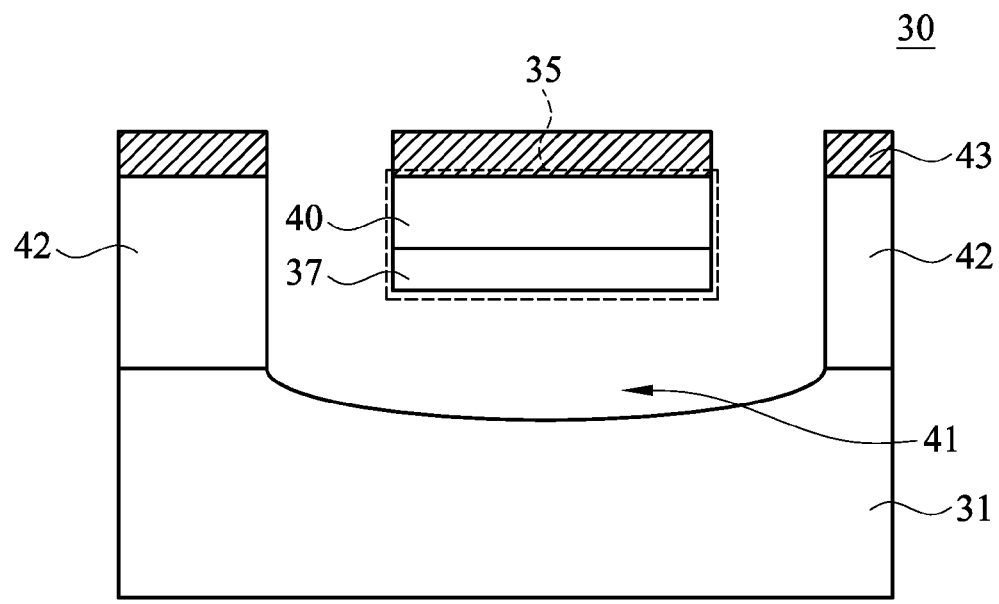
Figure 5H:
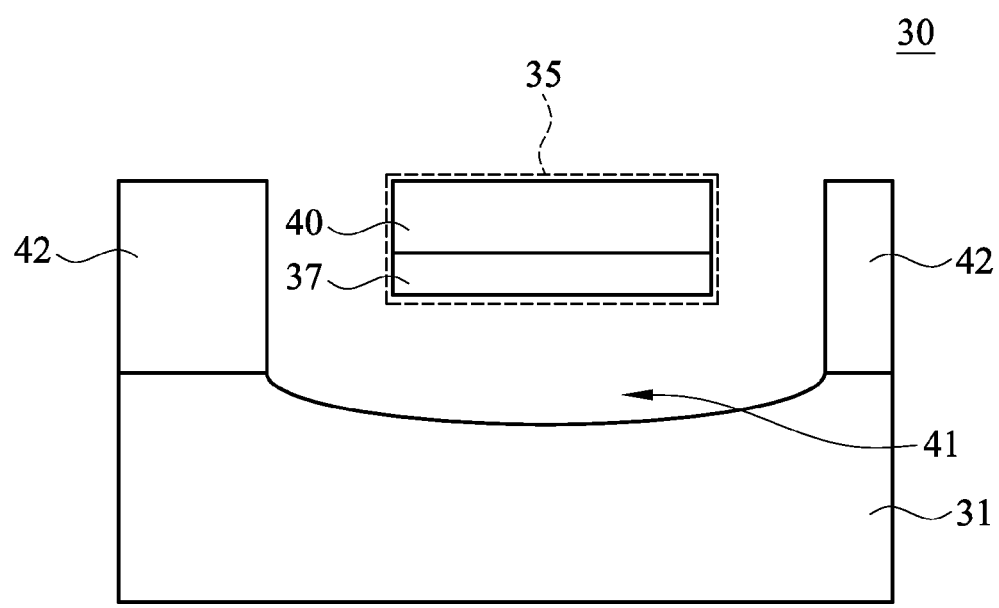

If the second etching process is prolonged, then after the first oxide layer 38 is etched out, the second etching process will start etching away the polisilicon layer 36 very quickly (as shown in FIG. 5F). In this embodiment, because the second oxide layer 39 is silicon dioxide, it is still etched by the second etching process. Although the second oxide layer 39 has a larger thickness than that of the first oxide layer 38, as long as the second etching process is given sufficient time, it might also completely etch out the second oxide layer 39, with the results shown in FIG. 5G Lastly, FIG. 5H shows the CMOS-MEMS cantilever structure 30 after the removal of the photoresistive layer 43. Therefore, in this embodiment, after the completion of the standard CMOS manufacturing process of the CMOS-MEMS cantilever structure 30, post manufacturing process is only further required in that a first etching process and a second etching process are conducted, to release the cantilever beam 35.

Because the first and second etching processes are both front-side etching processes, no extra protection device is required to be installed to protect the front-side of the CMOS-MEMS cantilever structure 30. Also, the first and second etching processes both employ dry etching technology such that problems like etchant residue in wet etching can be prevented, rendering the manufacturing process of the CMOS-MEMS cantilever structure 30 more straightforward. Furthermore, by simply controlling the duration of the second etching process, a cantilever beam 35 of various thicknesses can be acquired. However, only by arranging the piezoresistive material layer 37 at the bottom-most location of the cantilever beam 35 can the cantilever beam 35 attain a better sensing sensitivity.

The foregoing embodiments are provided to illustrate and disclose the technical features of the present invention so as to enable persons skilled in the art to understand the disclosure of the present invention and implement the present invention accordingly, and are not intended to be restrictive of the scope of the present invention. Hence, all equivalent modifications and variations made to the foregoing embodiments without departing from the spirit and principles in the disclosure of the present invention should fall within the scope of the invention as set forth in the appended claims.

What is claimed is:

1. A CMOS-MEMS cantilever structure, comprising:
   a substrate having a circuit area and a sensor unit area defined thereon;
   a circuit structure formed in said circuit area on said substrate; and
   a cantilever beam disposed in said sensor unit area, the cantilever beam having one end floating above said substrate and an opposite end connecting to said circuit structure, wherein
   said cantilever beam has a supporting material layer and a piezoresistive material layer, and
   said supporting material layer is a metal layer or an oxide layer.

2. The CMOS-MEMS cantilever structure of claim 1, wherein said substrate further includes a depressed area that is disposed in said sensor unit area and depressed inwards from a surface of said substrate.

3. A CMOS-MEMS cantilever structure, comprising:
   a substrate having a circuit area and a sensor unit area defined thereon;
   a circuit structure formed in said circuit area on said substrate; and
   a cantilever beam disposed in said sensor unit area, the cantilever beam having one end floating above said substrate and an opposite end connecting to said circuit structure, wherein
   said cantilever beam has a supporting material layer and a piezoresistive material layer, and
   said piezoresistive material layer is a polysilicon layer.

4. The CMOS-MEMS cantilever structure of claim 3, wherein said substrate further includes a depressed area that is disposed in said sensor unit area and depressed inwards from a surface of said substrate.

* * * * *